United States Patent [19]
Joyner

[11] Patent Number: 5,982,006
[45] Date of Patent: Nov. 9, 1999

[54] ACTIVE SILICON-ON-INSULATOR REGION HAVING A BURIED INSULATION LAYER WITH TAPERED EDGE

[75] Inventor: Keith A. Joyner, Dallas, Tex.

[73] Assignee: Texas Instruments Incorporated, Dallas, Tex.

[21] Appl. No.: 08/987,706

[22] Filed: Dec. 9, 1997

[51] Int. Cl.$^6$ .................................................. H01L 29/06
[52] U.S. Cl. .................... 257/347; 257/348; 257/349; 257/350; 257/351; 257/352; 257/353; 257/354; 438/219; 438/221; 438/296; 438/355
[58] Field of Search .................... 257/347–354; 438/219, 221, 296, 355

[56] References Cited

U.S. PATENT DOCUMENTS 5,517,047   5/1996   Linn et al. ............................. 257/347

FOREIGN PATENT DOCUMENTS 000075945   4/1983   European Pat. Off. ............... 257/347

*Primary Examiner*—Fetsum Abraham
*Attorney, Agent, or Firm*—Jacqueline J. Garner; W. James Brady, III; Richard L. Donaldson

[57] ABSTRACT

An active silicon-on-insulator region isolation structure is provided that includes an active bulk substrate region (24), an active silicon-on-insulator region (22), and a transition region positioned between the active bulk substrate region (24) and the active silicon-on-insulator region (22). The active silicon-on-insulator region (22) includes a silicon-on-insulator film (16) positioned above a buried insulator layer (18). The transition region includes a sloping portion of the buried insulator layer (18) and a tapered edge portion of the silicon-on-insulator film (16).

13 Claims, 1 Drawing Sheet

ACTIVE SILICON-ON-INSULATOR REGION HAVING A BURIED INSULATION LAYER WITH TAPERED EDGE

RELATED APPLICATIONS

This application is related to co-pending U.S. Provisional Application No. 08/987,408 entitled *Silicon-On-Insulator Trench Isolation Structure and Method for Forming*, filed on Dec. 9, 1996 (TI Docket No. TI-16766).

This invention was made with government support under F33615-89-C-5714 awarded by the United States Air Force. The government has certain rights in this invention.

TECHNICAL FIELD OF THE INVENTION

This invention relates generally to the field of semiconductor devices and more particularly to an active silicon-on-insulator region isolation structure and method for forming the same.

BACKGROUND OF THE INVENTION

The fabrication of silicon-on-insulator ("SOI") substrates or wafers using separation by implantation of oxygen ("SIMOX") involves the implantation of oxygen ions into a silicon bulk substrate to create a buried insulator layer or buried oxide layer ("BOX") below the upper surface of the silicon bulk substrate. As a result, an active SOI region is formed in the single-crystalline silicon bulk substrate located above the BOX. This area may be referred to as an SOI layer or film. The SIMOX process generally involves three steps: (1) cleaning a standard silicon wafer; (2) implanting oxygen ions under the surface of the wafer or substrate using a relatively high energy ion beam at around 200 keV at a dose of $O^+$ of around $2 \times 10^{18}/cm^2$; and (3) annealing the wafer at a high temperature that is greater than around 1300° C. for around six hours to help remove damage caused by the oxygen ion implantation.

SIMOX is generally the preferred process for building SOI substrates or wafers. SOI substrates can be used, for example, in very large scale integration ("VLSI") devices and ultra large scale integration ("ULSI") devices. SOI substrates or wafers generally provide, for example, one or more of the following advantages over bulk silicon wafers: (1) better radiation hardness; (2) higher speed performance; (3) higher temperature operations; (4) lower power devices; (5) lower cost process for some applications; and (6) easier implementation of submicrometer design rules. Furthermore, patterned SOI substrates or wafers provide additional advantages that include the ability to fabricate devices made from different technologies on a single substrate. This may include the implementation of smart power devices, mixed signal devices, and other devices that would require a high voltage isolation. Patterned SOI substrates refer to substrates that include active SOI regions, for building devices in an active SOI region, and active bulk substrate regions, for building devices in an active bulk substrate region.

The fabrication of patterned SOI substrates or wafers using SIMOX involves the selective implantation of oxygen ions into a silicon bulk substrate to produce active SOI regions and active bulk substrate regions. The active SOI regions are formed above a buried oxide layer ("BOX") that is formed as a result of the implantation of oxygen ions. Active SOI regions include an SOI film or layer of single-crystalline silicon that is present between the upper surface of the BOX and the upper surface of the silicon bulk substrate. However, the implantation of oxygen ions damages the silicon bulk substrate. Of particular interest are damaged areas created in the bulk substrate that are located in transition regions between active SOI regions and active bulk substrate regions. As a consequence, devices may not be fabricated in the damaged areas resulting in a significant amount of unavailable or non-productive wafer area. This significantly reduces overall integrated circuitry density.

The BOX, present in each active SOI region, has an upper and a lower surface and sides. The formation of the BOX below the surface of the silicon bulk substrate generates internal stresses due to the uneven expansion of the BOX during the SIMOX process. These internal stresses result in crystalline dislocations extending outwardly from all sides of the BOX which result in the formation of the damaged areas. Normally, the SOI wafer is annealed after oxygen implantation to allow some of the crystalline dislocations to be removed. However, the crystalline dislocations extending outwardly from the sides of the BOX and extending into both the active SOI region and the adjacent active bulk substrate region will not be removed by annealing. As a result of the implantation of oxygen ions, the transition region between an active SOI region and an active bulk substrate region is characterized by a large number of crystalline dislocations which define the damaged area. The damaged area extends into both the active SOI region and the active bulk substrate region and is not suitable for fabricating devices. These crystalline dislocations cause undesirable leakage currents. Hence, the overall circuitry design must provide for sufficient device spacing to avoid these damaged areas. This significantly reduces overall wafer or die area available for device fabrication.

SUMMARY OF THE INVENTION

From the foregoing it may be appreciated that a need has arisen for an active silicon-on-insulator region isolation structure and method for forming the same that eliminate or reduce the problems described above. In accordance with the present invention, an active silicon-on-insulator region isolation structure and method for forming the same are provided to relieve the internal bulk substrate stresses created during the formation of a buried insulator layer while fabricating a patterned SIMOX substrate or wafer. The reduction in the internal stresses prevent or reduce the formation of crystalline dislocations which define a damaged area that reduces overall circuitry density. Thus, overall integrated circuitry density may be significantly increased due to the elimination or reduction of the damaged area at the junction between an active SOI region and an active bulk substrate region.

According to an embodiment of the present invention, an active silicon-on-insulator region isolation structure is provided that includes an active bulk substrate region, an active silicon-on-insulator region, and a transition region positioned between the active bulk substrate region and the active silicon-on-insulator region. The active silicon-on-insulator region includes a silicon-on-insulator film positioned above a buried insulator layer. The transition region includes a sloping portion of the buried insulator layer and a tapered edge portion of the silicon-on-insulator film. Thus, adjacent microelectronic devices may be fabricated on the active bulk substrate region and the active silicon-on-insulator region without having to provide large spacing regions between such devices.

The present invention provides various technical advantages. A technical advantage of the present invention includes the reduction or elimination of horizontal or nearly horizontal crystalline dislocations caused by the formation of a BOX within a silicon bulk substrate. This increases overall wafer or die area that is available for device fabrication, and hence, overall integrated circuitry density is significantly increased. This may be accomplished without having to waste considerable substrate area due to device spacing requirements caused by the crystalline dislocations in the transition region between active regions. Another technical advantage of the present invention includes the ability to use existing SIMOX implantation methods and techniques to create a patterned SOI substrate of the present invention. Other technical advantages are readily apparent to one skilled in the art from the following FIGUREs, description and claims.

BRIEF DESCRIPTION OF THE DRAWINGS

For a more complete understanding of the present invention and the advantages thereof, reference is now made to the following brief description, taken in connection with the accompanying drawings and detailed description, wherein like reference numerals represent like parts or similar areas, in which.

DETAILED DESCRIPTION OF THE INVENTION

Figure 1A:
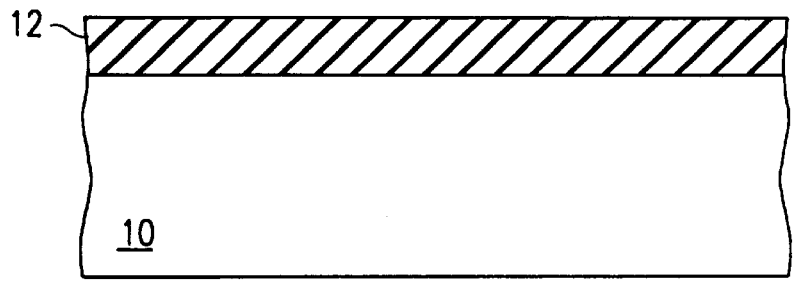
FIGS. 1A through 1D are a series of schematic cross-sectional diagrams illustrating one embodiment of an active silicon-on-insulator region isolation structure and method for forming the same.

FIGS. 1A through 1D are a series of schematic cross-sectional diagrams illustrating one embodiment of the fabrication of an active silicon-on-insulator region isolation structure of the present invention. The illustrated embodiment of the active silicon-on-insulator region isolation structure may be used in or fabricated in an SOI substrate or wafer. Referring now to FIG. 1A, a bulk substrate 10 is provided with a blocking layer 12 provided on an upper surface of bulk substrate 10. Bulk substrate 10 will generally be constructed from single-crystalline silicon and blocking layer 12 will generally be provided as an amorphous insulator such as silicon dioxide ("$SiO_2$"). However, blocking layer 12 may be fabricated using any type of ion blocking material such as $SiO_2$, $SiN_4$, and $SiO_xN_y$. Blocking layer 12 may be formed using conventional oxidation or deposition techniques. The deposition techniques may include any known or available technique such as chemical vapor deposition, plasma chemical vapor disposition, plasma enhanced chemical vapor deposition, and spin on layers.

Figure 1B:
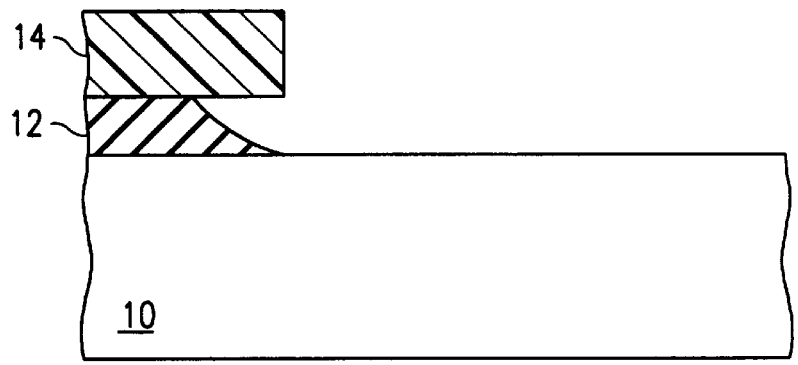

Referring now to FIG. 1B, a photoresist 14 layer is applied to the upper surface of blocking layer 12. Photoresist layer 14 may be applied using any known or conventional technique such as by spinning a wafer or substrate and applying photoresist layer 14. The wafer is then patterned and masked using conventional photolithographic techniques to expose areas of blocking layer 12 that reside over active bulk substrate regions. The remaining structure is then etched resulting in the removal of the exposed areas of blocking layer 12 and portions of the unexposed areas of blocking layer 12 that reside under the remaining or unexposed portions of photoresist layer 14.

After etching, a remaining portion of blocking layer 12 is present below photoresist layer 14. As is illustrated, the remaining portion of blocking layer 12 that resides beneath photoresist layer 14 has been partially etched in the horizontal direction through either an isotropic etching process or an anisotropic etching process that is not completely anisotropic. The etching process may be performed using any known or conventional etching technique such as HF wet etching or plasma etching. An isotropic etching process is, by definition, an etching process that proceeds in all directions at the same rate. An isotropic etching process is any etching process that is not isotropic. A completely anisotropic etching process is one that proceeds exclusively in one direction. Since many etching processes fall between the extremes of being isotropic and completely anisotropic, often a degree of anisotropy is desired. In the present invention, and as illustrated in FIG. 1B, it is desirable to have some rate of horizontal etching so that a portion of blocking layer 12 is removed during the etching process to develop a desired edge profile on blocking layer 12. Therefore, the present invention will include some horizontal etching as well as vertical etching.

The portion of blocking layer 12 that remains on the surface of bulk substrate 10 will include an edge profile such as a sloped edge profile. The sloped edge profile is provided so that when oxygen ion implantation is performed in a later step, a BOX will be created in the transition region, between an active SOI region and an active bulk substrate region, that includes a sloping portion that corresponds to or is related to the sloped edge profile of block layer 12. The sloping portion of the BOX helps relieve internal stresses generated within bulk substrate 10 during the formation of the BOX. The sloped edge profile of blocking layer 12 may be formed at any desired angle such as forty-five degrees.

Figure 1C:
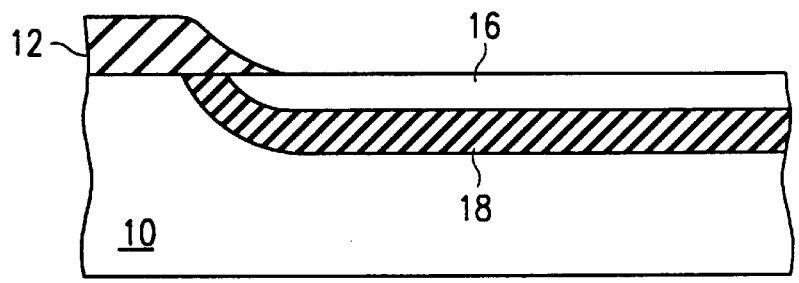

Referring next to FIG. 1C, photoresist layer 14 is removed or stripped and an oxygen ion implantation is performed to generate a buried insulator layer 18. The oxygen ion implantation procedure will generally be performed as part of a SIMOX implant. As a result of performing the oxygen ion implantation, an SOI film 16 is positioned between the upper surface of buried insulator layer 18 and the upper surface of bulk substrate 10. SOI film 16 will be made of single-crystalline silicon if bulk substrate 10 is provided as single-crystalline silicon.

Due to the presence of blocking layer 12 and its sloped edge profile, the oxygen ion implantation results in the formation of a sloping portion of buried insulator layer 18. The sloping portion generally follows the sloped edge profile of blocking layer 12. The sloping portion of buried insulator layer 18 extends towards the surface of bulk substrate 10 as shown in FIG. 1C and is included as part of a transition region between the two active regions. However, it should be understood that the present invention may include the fabrication of buried insulator layer 18 such that buried insulator layer 18 extends either up to, near, or towards the surface of bulk substrate 10. At the thickest portion of blocking layer 12, the oxygen ion implantation cannot reach bulk substrate 10 to form buried insulator layer 18. The angle of the sloped edge profile of blocking layer 12 and the corresponding angle of the sloping portion of buried insulator layer 1B may be equal to, greater than, or less than forty-five degrees.

As a result of the oxygen ion implantation, crystal dislocations are formed around buried insulator layer 18. Most of these crystal dislocations may be removed through a subsequent annealing process. However, due to the sloping portion of buried insulator layer 18 that extends toward the surface of bulk substrate 10, unremovable crystalline dislocations that normally occur within bulk substrate 10 at the transition region between the active SOI region and the active bulk substrate region are significantly reduced or eliminated. The sloping portion of buried insulator layer 18 helps relieve internal stresses within bulk substrate 10 which reduces or eliminates the crystalline dislocations around the sloping portion of buried insulator layer 18. As a consequence, microelectronic devices, both SOI devices and bulk substrate devices may be fabricated more closely together because additional spacing is not required to avoid the crystalline dislocations in the transition region between active SOI regions and active bulk substrate regions.

The thickness of buried insulator layer 18 will generally be provided at around 210 nanometers while the thickness of SOI film 16 will be at some lesser thickness than that of buried insulator layer 18. However, it should be understood that even though a general thickness has been specified, the present invention is in no way limited to any one particular thickness and may in fact be provided virtually any desired thickness.

Figure 1D:
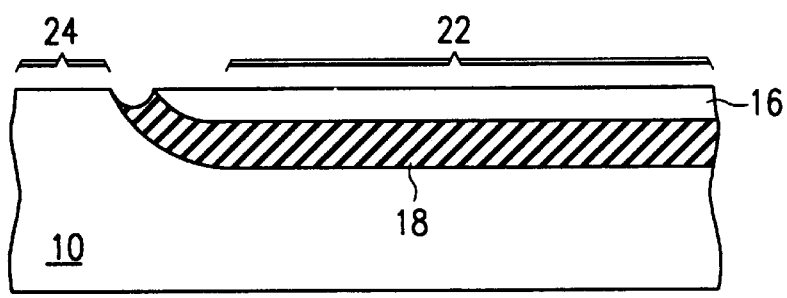

Referring finally to FIG. 1D, the entire wafer or structure is annealed at a high temperature, such as 1300° C. for around six hours, to recover the crystalline quality of bulk substrate 10. As a consequence of the annealing process, buried insulator layer 18 slightly increases in thickness and SOI film 16 slightly decreases in thickness. This results as oxygen molecules are combined within buried insulator layer 18 to form additional $SiO_2$ molecules. The crystalline quality of SOI film 16 is also recovered from the crystalline damage caused by the oxygen ion implantation. However, and as was mentioned previously, the sloping portion of buried insulator layer 18 prevents the formation of crystalline dislocations that, in the absence of the sloping portion, would extend from the sides of buried insulator layer 18 and would extend well into an adjacent active bulk substrate region. In such a case, active bulk substrate regions and active SOI regions must be spaced far enough apart to avoid these crystalline dislocation regions that cannot be removed through annealing. Therefore, as a result of the sloping portion of buried insulator layer 18, this problem is greatly reduced or eliminated.

Blocking layer 12 is then etched and removed using any known or conventional etching technique. As a consequence, a portion of buried insulator layer 18 may be etched below the surface of bulk substrate 10 as shown in FIG. 1D. An active SOI region 22 and an active bulk substrate region 24 are also denoted in FIG. 1D. Active SOI region 22 denotes the portion of SOI film 16 which defines an active region such that an SOI device may be fabricated. As is illustrated, active SOI region 22 will generally extend to the regions in which buried insulator layer 18 is somewhat flat or uniform. This allows for the later fabrication of SOI devices having more uniform and predictable characteristics. Active bulk substrate region 24 denotes the area below which a bulk substrate active region may be defined within bulk substrate 10. Thus, the present invention allows microelectronic devices, such as field-effect transistors and microelectronic mechanical systems, to be fabricated on the same wafer or substrate and within close proximity to each other.

The only region of the structure in which devices may not be fabricated is in the transition region extending between active bulk substrate region 24 and active SOI region 22. The transition region includes the sloping portion of buried insulator layer 18 that extends toward the surface of bulk substrate 10 and the tapered edge portion of SOI film 16 that is located above the sloping portion of buried insulator 18. The distance of the transition region will generally be much less than the spacing required to avoid a damaged area with large crystalline dislocations that would be present in the absence of the sloping portion of buried insulator layer 18.

Thus, it is apparent there has been provided, in accordance with the present invention, an active silicon-on-insulator region isolation structure and method for forming the same that satisfy the advantages set forth above. The present invention eliminates or reduces the internal stresses that cause the crystalline dislocations located between active SOI regions and active bulk substrate regions. The crystalline dislocations are caused by the development of a buried insulator layer within a silicon bulk substrate without a sloping portion that extends toward the surface of the bulk substrate. Although the preferred embodiment has been described in detail, it should be understood that various changes, substitutions, and alterations can be made herein without departing from the scope of the present invention. For example, although the structure of the present invention has been illustrated and described using conventional semiconductor fabrication techniques, other techniques, whether currently known or not, could potentially be used to fabricate the active silicon-on-insulator region isolation structure of the present invention. Also, some of the steps described and illustrated in the preferred embodiment as discrete or separate steps may be combined into one step without departing from the scope of the present invention. Other examples of changes, substitutions, and alterations are readily ascertainable by one skilled in the art and could be made without departing from the spirit and scope of the present invention as defined by the following claims.

What is claimed is:

1. An integrated circuit comprising:

a bulk substrate region;

a silicon-on-insulator region having a first pair of opposing surfaces; and a buried insulator layer having a second pair of opposing surfaces, one of said second pair of surfaces located between said bulk substrate region and said silicon-on-insulator region and abutting said substrate region, said one of said second surfaces of said buried insulator layer having an edge portion sloped toward the other of said first pair of surfaces of said silicon-on-insulator region to create a tapered edge portion in said silicon-on-insulator region.

2. The integrated circuit of claim 1, wherein the silicon-on-insulator region and the buried insulator layer are substantially parallel except at said edge portion.

3. The integrated circuit of claim 1, wherein said bulk substrate region comprises a bulk silicon substrate.

4. The integrated circuit of claim 3, wherein the sloping edge portion of the buried insulator layer extends to the surface of the bulk silicon substrate.

5. The integrated circuit of claim 1, wherein the silicon-on-insulator region comprises single-crystalline silicon.

6. The integrated circuit of claim 1, wherein the sloping portion of the buried insulator layer angles towards the upper surface at an angle of around about forty-five degrees.

7. The integrated circuit of claim 1, wherein the sloping portion of the buried insulator layer angles toward the upper surface at an angle that is greater than forty-five degrees.

8. The integrated circuit of claim 1, wherein the sloping portion of the buried insulator layer angles towards the upper surface at an angle that is less than forty-five degrees.

9. An integrated circuit comprising:

a substrate having a surface;

a buried insulator layer located in said substrate separating a bulk substrate region of said substrate from a silicon-on-insulator region of said substrate, said buried insulator layer having an edge portion that slopes toward said surface of said substrate creating a tapered edge in said silicon-on-insulator region;

a first microelectronic device located in the bulk substrate region; and a second microelectronic device located in said silicon-on-insulator region.

10. The integrated circuit of claim 9, wherein the substrate comprises a silicon bulk substrate.

11. The integrated circuit of claim 9, wherein the sloping edge of the buried insulator layer extends towards the surface of the substrate at an angle of around about forty-five degrees.

12. The integrated circuit of claim 9, wherein the sloping edge of the buried insulator layer extends towards the surface of the substrate at an angle that is greater than forty-five degrees.

13. The integrated circuit of claim 9, wherein the sloping portion of the buried insulator layer extends towards the surface of the substrate at an angle that is less than forty-five degrees.

* * * * *